United States Patent [19]
Wyatt

[11] Patent Number: 5,603,111
[45] Date of Patent: Feb. 11, 1997

[54] SYNCHRONOUS TRACKING AM RECEIVER

[75] Inventor: Michael A. Wyatt, Clearwater, Fla.

[73] Assignee: Honeywell Inc., Minneapolis, Minn.

[21] Appl. No.: 496,548

[22] Filed: Jun. 29, 1995

Related U.S. Application Data

[63] Continuation of Ser. No. 334,896, Nov. 4, 1994, abandoned, which is a continuation of Ser. No. 905,802, Jun. 29, 1992, abandoned.

[51] Int. Cl.$^6$ .................................. H04B 1/16; H03D 1/00
[52] U.S. Cl. .......................... 455/215; 455/258; 329/359
[58] Field of Search .................................... 455/215, 236, 455/237, 258, 208; 329/359, 358

[56] References Cited

U.S. PATENT DOCUMENTS 3,119,065   1/1964   Blake ........................................ 329/359

FOREIGN PATENT DOCUMENTS 0201061   11/1986   Germany .

OTHER PUBLICATIONS

Shrader, Robert L., Electronic Communication, 1985 pp. 207–208.

Funkschau, vol. 62, No. 20, 21 Sep. 1990, pp. 113–115 entitled "Einfacher Kurzwellen–Empfanger," Parts 1 and 2 (Portions Translated).

Elektor, vol. 10, No. 7/8, Jul. 1984, pp. 7–59, entitled "FM Pocket Radio" by P. Engel.

Elektor Book 75 (1977), p. 12, entitled "Sensitive Coil–Lists Sinchrodyne Receiver for MW LW".

IEEE Journal of Solid State Circuits, vol. SCE–20, No. 6, Dec. 1985, entitled "The Synchronous Oscillator: a Synchronization and Tracking Network," by Basil Uzunoglu and Marvin White.

*Primary Examiner*—Reinhard J. Eisenzopf
*Assistant Examiner*—Doris To
*Attorney, Agent, or Firm*—Thomas A. Rendos

[57] ABSTRACT

An improved synchronous tracking AM receiver having low power requirements and a small size. The synchronous tracking AM receiver provides signal tracking capability and sensitivity approaching a conventional superhetrodyne receiver. The synchronous tracking AM receiver includes an RF amplifier synchronous input section which couples input signals to a synchronization filter circuit, including a modified Colpitts oscillator. The Colpitts oscillator recycles the signal to generate a high Q output signal. The output signal of the synchronization circuit is coupled to a low pass filter, then amplified by a low frequency amplifier and triggered to produce a digital output signal.

9 Claims, 2 Drawing Sheets

SYNCHRONOUS TRACKING AM RECEIVER

This application is a continuation of application Ser. No. 08/334,896, filed on Nov. 4, 1994, now abandoned, which is a continuation of application Ser. No. 07/905,802, filed on Jun. 29, 1992, also abandoned.

FIELD OF THE INVENTION

The present invention relates generally to AM receivers and more particularly to an improved synchronous tracking AM receiver with characteristics approaching a conventional superhetrodyne narrow band receiver.

BACKGROUND OF THE INVENTION

AM receivers are utilized in numerous applications and are desirable for utilization in low power, small size applications, such as in portable command receivers. To obtain the desired sensitivity, most conventional AM receivers are of a superhetrodyne design or are based upon the superhetrodyne design. The superhetrodyne design produces the desired operating characteristics, but at the cost of relatively large size components and high power requirements which result in a large size receiver unit. This essentially precludes the superhetrodyne design from utilization in small size and/or low power applications.

Applicant researched the available receiver designs with a desired goal of designing a low power, small size AM receiver. In doing this research, applicant discovered some publications by Vasil Uzunoglu, such as *The Synchronous Oscillator: A Synchronization and Tracking Network, IEEE JOURNAL OF SOLID-STATE CIRCUITS,* Vol. SC-20, No. 6, December, 1985, directed to a synchronous oscillator for use in clock recovery systems. Applicant analyzed the circuit and surmised that the circuit must be operating to also demodulate the tracked signal. Applicant then built a test circuit to simulate what Applicant thought must be the active demodulating node. The test circuit initially appeared not to work or not to produce the surmised demodulated signal. Applicant, after further analysis, again concluded that the circuit must be producing a demodulated signal. Applicant again modulated the input of the test circuit with an RF signal, but additionally added a low pass filter coupled to the believed active node. The low pass filter revealed the presence of the demodulated signal, which resulted in the present invention. From reviewing the V. Uzongolu articles, it is apparent that the demodulating capability of the synchronous oscillator was not discovered by V. Uzonoglu.

The present invention therefore was developed to solve the desirable goal of providing a small size, low power AM receiver.

SUMMARY OF THE INVENTION

The present invention is directed to an improved synchronous tracking AM receiver having low power requirements and a small size, while provided signal tracking capability and sensitivity approaching a conventional superhetrodyne receiver. The synchronous tracking AM receiver includes an RF amplifier input which couples input signals to a synchronization filter circuit, including a modified Colpitts oscillator. The output of the synchronization circuit is coupled to a low pass filter, then amplified by a low frequency amplifier and triggered to produce a digitally compatible demodulated AM signal.

These and other features and advantages of the invention will be more readily apparent upon reading the following description of a preferred exemplified embodiment of the invention and upon reference to the accompanying drawings wherein:

BRIEF DESCRIPTIONS OF THE DRAWINGS

While the invention will be described and disclosed in connection with certain preferred embodiments and procedures, it is not intended to limit the invention to those specific embodiments. Rather it is intended to cover all such alternative embodiments and modifications as fall within the spirit and scope of the invention.

DESCRIPTION OF THE PREFERRED EMBODIMENTS

Figure 1:
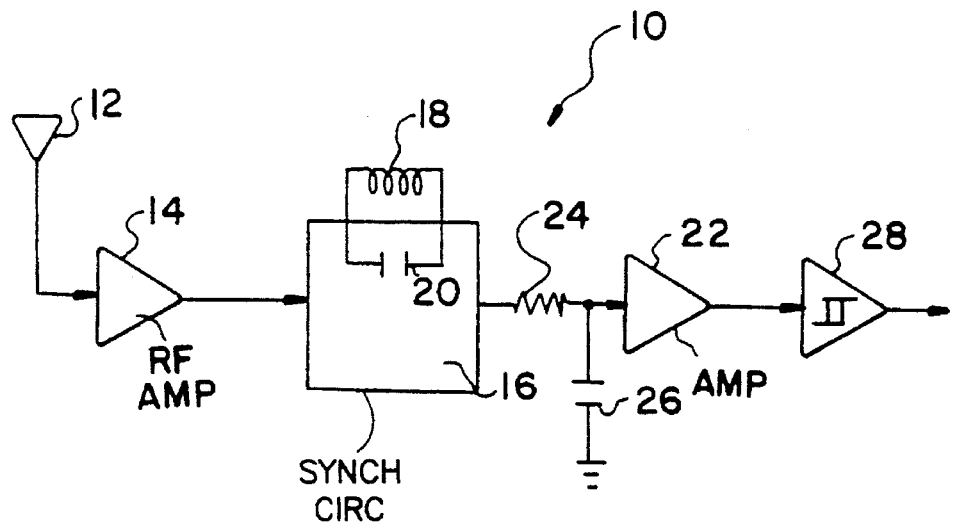
FIG. 1 is a schematic diagram of the synchronous tracking AM receiver of the present invention.

Referring to FIG. 1, one block diagram embodiment of an improved synchronous tracking AM receiver of the present invention is designated generally by the reference numeral 10. The synchronous tracking AM receiver 10 includes an antenna 12, which couples a received signal to an RF amplifier 14. The RF amplifier 14 amplifies the received signal and couples the signal to a synchronization filter circuit 16. The RF amplifier 14 can be a tuner or a broadband conventional RF amplifier.

The synchronization circuit 16 includes a coil 18 which is coupled in parallel with a capacitor 20. As illustrated, the coil 18 may be formed as a separate element off of the integrated circuit chip in which most of the circuit elements of the synchronous tracking AM receiver can be formed. The values of the coil 18 and the capacitor 20 are chosen to select the center frequency of the synchronous tracking AM receiver 10.

The signal from the synchronization circuit 16 is coupled to a low frequency amplifier 22 via a low pass data filter formed by a resistor 24 and a capacitor 26. Again, as illustrated, the resistor 24 and the capacitor 26 generally would be formed as separate elements from the rest of the synchronous tracking AM receiver 10 integrated circuit chip (not illustrated). The signal from the low frequency amplifier 22 preferably is coupled to a Schmidt trigger 28. The Schmidt trigger 28 produces a digital signal output, which then can be utilized in a conventional manner.

The synchronous tracking AM receiver 10 provides tracking capability and excellent sensitivity which approaches a superhetrodyne design. The synchronous tracking AM receiver 10 provides this result while eliminating many of the most undesirable elements of the conventional superhetrodyne design. The synchronous tracking AM receiver 10 design eliminates the input RF mixer, the superhetrodyne local oscillator (typically a separate crystal), the IF filter(s), the IF amplifier(s), the complicated AFC (automatic frequency control) or PLL (phase locked loop) circuitry and the data demodulator. This allows the whole synchronous tracking AM receiver 10 to be formed on an integrated circuit chip with the separate elements, above designated, having total overall dimension of less than two-tenths (0.2) inches per side.

Figure 2:
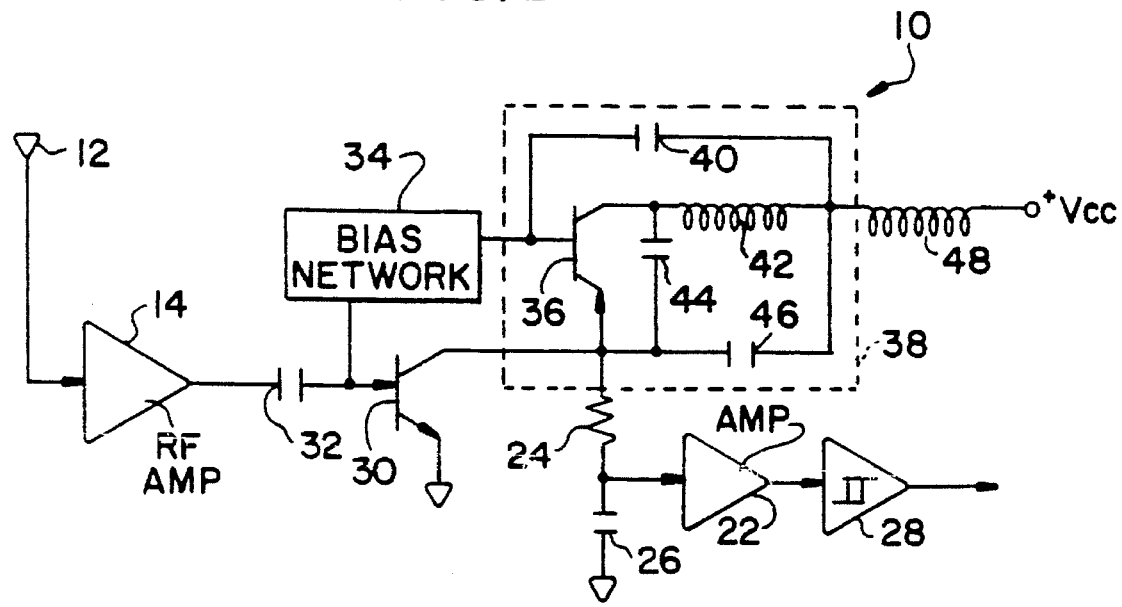
FIG. 2 is a more general embodiment of the synchronous tracking AM receiver of FIG. 1.

The operation of the synchronous tracking AM receiver 10 will now be described referring to and as illustrated in further detail in FIG. 2. The operation of the synchronous tracking AM receiver 10 is not the same as that of a conventional receiver and indeed the circuit operates in a very non-conventional manner. The synchronous tracking AM receiver 10 elements will include the same reference numerals for identical or substantially identical elements in each of the FIGURES. The signal from the RF amplifier 14 is coupled to the base of a transistor 30 via a RF coupling capacitor 32.

A bias network 34 also is coupled between the base of the transistor 30 and the base of a second transistor 36. The transistor 36 forms the active element of a modified Colpitts oscillator 38. The Colpitts oscillator 38 includes the transistor 36, a RF coupling capacitor 40, a coil 42 and a pair of capacitors 44 and 46. The elements of the Colpitts oscillator 38 are dictated by the frequency for which the synchronous tracking AM receiver 10 is designed. The Colpitts oscillator 38 is isolated by a radio frequency choke 48 from the power supply voltage $^+V_{cc}$. The choke 48 also could be another type of isolation device, such as a resistor or transistor, (not illustrated).

The transistor 30 injects current into the Colpitts oscillator 38 and provides a sink for the transistor 36 steady state emitter current, since the transistor 36 does not have a return path through ground. The transistor 36 appears to be a narrow band filter to the transistor 30 at the center frequency of the synchronous tracking AM receiver 10. The coil 42 typically has a Q of less than one hundred (100). The effective Q of the Colpitts oscillator 38, as seen by a signal injected by the transistor 30, is on the order of ten thousand (10,000) or greater. The apparent very high Q of the Colpitts oscillator 38 is generated because the Colpitts oscillator 38 is a regenerative circuit. In effect, the signal is recirculated until the Colpitts oscillator 38 approaches saturation. Each time the signal recirculates, the effective Q of the circuit is multiplied by the actual circuit Q.

The Colpitts oscillator 38 also operates in another unique mode. The amplitude of the signal generated by the Colpitts oscillator 38 is almost constant over the bandwidth of the synchronous tracking AM receiver 10. The tracking bandwidth or the range over which the synchronous tracking AM receiver 10 will track an input RF signal is directly proportional to the input signal amplitude. When the input signal is AM modulated (carries an AM signal), the tracking bandwidth also effectively is modulated.

Applicant, by analyzing the test circuit, recognized that since the amplitude effectively controls the bandwidth, then the Colpitts oscillator 38 non-linearity can be utilized to obtain the desired demodulated AM signal. Thus, the Colpitts oscillator 38 functions effectively as a non-linear filter with the current from the transistor 30 effectively controlling the filter function. At the same time, the Colpitts oscillator 38 acts as an AM signal demodulator.

One drawback of the synchronous tracking AM receiver 10, is that the synchronous tracking AM receiver 10 is not very selective since the tracking depends upon the input signal amplitude. Thus, if the synchronous tracking AM receiver 10 is tuned to select a small amplitude signal and a higher amplitude signal is received, the high amplitude signal is acted upon to the exclusion of the desired small amplitude signal. One way of solving this drawback is to use a high selectivity RF amplifier 14. The selectivity of the synchronization circuit can be improved by including a surface acoustic wave (SAW) device (not illustrated) coupled in parallel with the coil 42. This increases the size of the synchronous tracking AM receiver 10, but also locks in a very accurate signal frequency on the order of one tenth (0.1) to one (1.0) percent. The SAW would effectively be in parallel with the coil 42, which results in a lower equivalent inductance, but provides a very controlled oscillator frequency.

The output signal from the Colpitts oscillator 38 is coupled to the amplifier 22 through the low pass filter formed by the resistor 24 and the capacitor 26. The signal from the amplifier 22 then is coupled to the Schmidt trigger 28 which generates the digital signal. The synchronous tracking AM receiver 10 as described can operate from a $^+V_{cc}$ of less than three (3.0) volts and operate beyond one (1) $GH_z$.

In designing the Colpitts oscillator 38, $\omega_o$ is approximately equal to the square root of the value of the sum of the capacitance of the capacitors 44 and 46, divided by the product of the capacitor 44, the capacitor 46 and the coil 42. The output signal from the low pass filter (the resistor 24 and the capacitor 26) reflects the average subtle changes in the voltage on the emitter of the transistor 36. The values of the resistor 24 and the capacitor 26 are designed around the design data rate of the synchronous tracking AM receiver 10. The amplifier 22 is a non-critical element and can be any conventional, low frequency amplifier with sufficient gain at the design data rate. The Schmidt trigger 28 could be a comparator or limiter type of device which produces the desired digital output signal.

One of the more important features of a receiver is the lockup time of the receiver or time that expires while the receiver is locking onto an input signal in the predetermined design tracking range. This time is proportional in conventional tracking circuits to about $Q^2$. Thus, when a receiver has a desirable high Q (high sensitivity), then the receiver can have an undesirably long lockup time period. The synchronous tracking AM receiver 10 has a very fast lockup time, because the synchronization circuit 38 appears to have the initial low Q to the input signal. The input signal does not see the very high recirculated signal Q, initially. The effective circuit Q grows quickly after the initial lockup. Therefore, the synchronous tracking AM receiver 10 has both desirable features of a fast lockup time and a high Q.

Further, the synchronous tracking AM receiver 10 can operate at high data rates since the synchronous tracking AM receiver easily can lock quickly and unlock. Also, the synchronous tracking AM receiver 10 has a memory type capability in that after an input signal is removed (unlock), the synchronous tracking AM receiver 10 slowly drifts back to the resident oscillator frequency. Therefore, if a signal is sent, terminated and then restarted in a fairly short time period, then the synchronous tracking AM receiver 10 locks up almost instantly. This feature allows the synchronous tracking AM receiver 10 to operate with burst type transmissions. In fact, this is the mode of operation when the synchronous tracking AM receiver 10 is used with OOK (On, Off, Keying) or one hundred (100) percent modulated AM transmissions.

Figure 3:
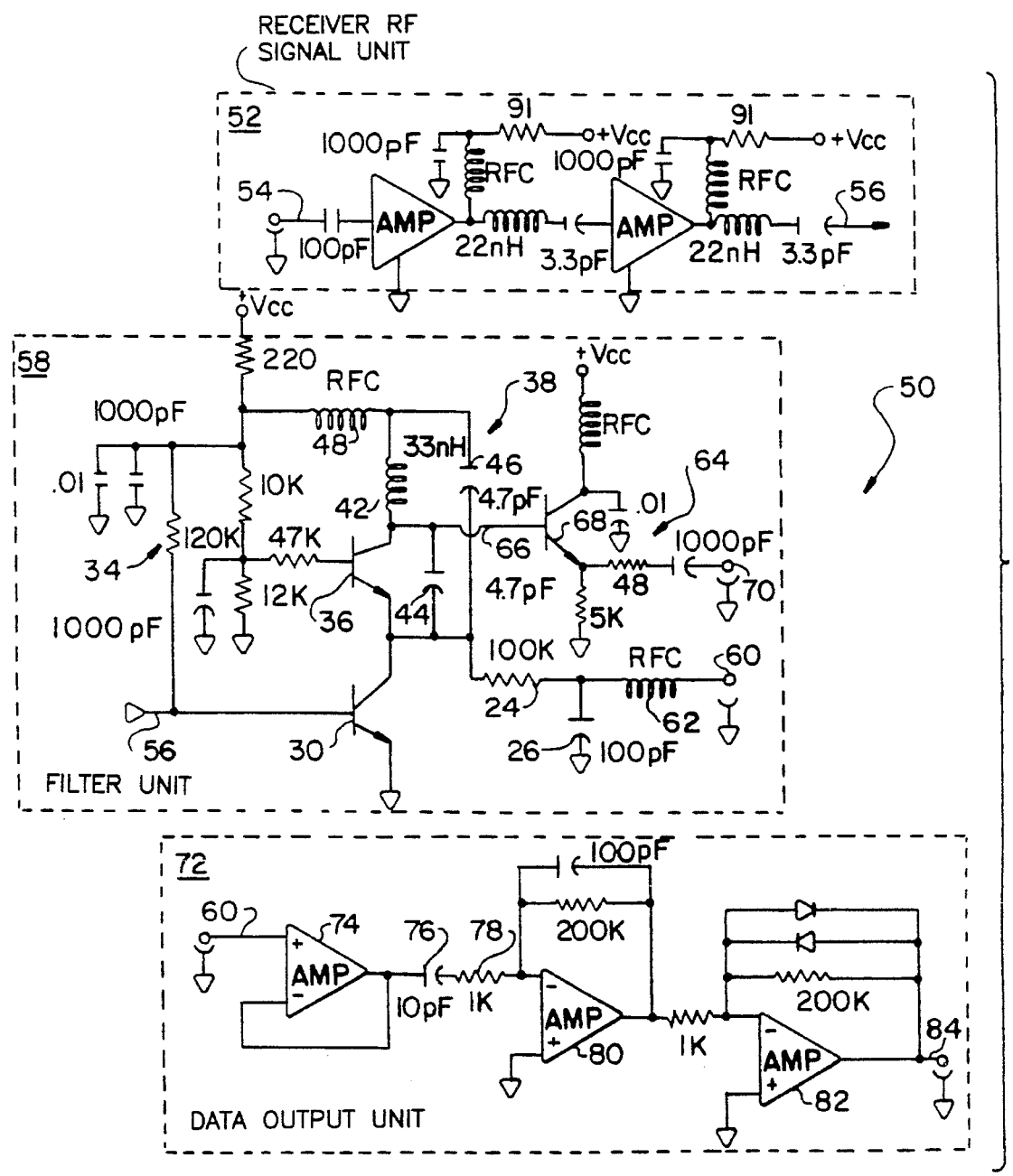
FIG. 3 is one specific embodiment of one synchronous tracking AM receiver utilizing the present invention.

One specific operational embodiment of a synchronous tracking AM receiver is illustrated in FIG. 3 and designated generally by the reference numeral 50. The synchronous tracking AM receiver 50 includes three units, a first conventional receiver RF signal unit 52 which receives the input signals from the antenna 12 on a line 54. The unit 52 conditions the input signal in a conventional manner and couples it to the transistor 30 on an output line 56. The transistor 30 forms a portion of an oscillator or filter unit 58. The filter unit 58 contains the elements of the Colpitts oscillator 38 and the low pass filter and generates the demodulated signal on a line 60 via the resistor 24 and the capacitor 26.

Additionally, the oscillator output optionally can be monitored via a test buffer 64, which is coupled to the Colpitts oscillator 38 via a line 66. The test buffer 64 includes a transistor 68, having its base connected to the line 66. The transistor 68 generates a buffered oscillator/filter signal on an output line 70.

The demodulated signal on the line 60 is coupled to a conventional data output unit 72. This data output unit 72 includes a first unit gain amplifier 74, which functions as a signal follower/buffer device. The signal from the amplifier 74 is coupled via a coupling capacitor 76 and a resistor 78 to a high gain amplifier 80. The signal from the amplifier 80 is coupled to a gain limiting amplifier 82, which amplifies small signals and attenuates large signals to generate a substantially constant amplitude output signal on a line 84.

The element values given for the specific receiver embodiment 50, were not optimized for $^+V_{cc}$ and were operated at a $^+V_{cc}$ of about five (5) volts. The center frequency of the resulting receiver 50 is about 584 MH$_z$, with a sensitivity of better than −95 dbm and a data rate of about 4800 baud.

Modification and variations of the present invention are possible in light of the above teachings. It is therefore to be understood that within the scope of the appended claims, the invention may be practiced other than is specifically described.

The embodiments of an invention in which an exclusive property or right is claimed are defined as follows:

1. A synchronous tracking AM receiver, comprising:

injection means for generating an injection signal in response to an RF input signal;

oscillator means including an oscillator connected to said injection means for generating a continuous oscillating signal and for providing a tracking bandwidth at a center frequency of the synchronous tracking AM receiver which is directly proportional to said injection signal over which the synchronous tracking AM receiver will track said RF input signal, said oscillator means including bias means for continuously operating said oscillator to exhibit non-linearity for demodulation so as to generate a tracking oscillating signal in response to said injection signal; and means for filtering said tracking oscillating signal to generate a demodulated AM output signal.

2. A receiver according to claim 1, wherein said oscillator means includes a modified Colpitts oscillator.

3. A receiver according to claim 2, wherein said injection means includes a first transistor and said modified Colpitts oscillator includes a second transistor, said tracking oscillating signal being applied to said filtering means at a junction between said first transistor and said second transistor.

4. A receiver according to claim 1, wherein said filtering means includes a low pass filter formed by a resistor and a capacitor in series with a junction therebetween, said demodulated AM output signal being generated at said junction.

5. A receiver according to claim 4, wherein said filtering means further includes means for generating a digital output signal from said demodulated AM output signal.

6. A synchronous tracking AM receiver, comprising:

means for synchronizing and filtering an RF input signal, said synchronizing and filtering means including a modified Colpitts oscillator for generating a continuous oscillating signal at a predetermined input signal frequency;

injection means including a transistor to couple said RF input signal to said modified Colpitts oscillator for injecting a current into said synchronizing and filtering means, said modified Colpitts oscillator being continuously operated to provide a tracking bandwidth at a center frequency and to exhibit non-linearity for demodulation so as to generate a tracking oscillating signal in response to an amplitude of said injected current; and means for filtering said tracking oscillating signal to generate a demodulated AM output signal.

7. A receiver according to claim 6, wherein said filtering means includes a low pass filter formed by a resistor and a capacitor in series with a junction therebetween, said demodulated AM output signal being generated at said junction.

8. A receiver according to claim 7, wherein said filtering means further includes means for generating a digital output signal from said demodulated AM output signal.

9. A receiver according to claim 8, wherein said generating means includes means for generating a substantially constant amplitude digital output signal.

* * * * *